United States Patent [19]

Xu et al.

[11] Patent Number: 5,668,516

[45] Date of Patent: Sep. 16, 1997

[54] SIMPLIFIED ACTIVE SHIELD SUPERCONDUCTING MAGNET ASSEMBLY FOR MAGNETIC RESONANCE IMAGING

[75] Inventors: Bu-Xin Xu; Ronald F. Lochner, both of Florence, S.C.

[73] Assignee: General Electric Company, Milwaukee, Wis.

[21] Appl. No.: 581,100

[22] Filed: Dec. 29, 1995

[51] Int. Cl.$^6$ ........................................ H01H 1/00
[52] U.S. Cl. ........................ 335/216; 335/299; 335/301; 324/318; 62/51.1
[58] Field of Search .................. 335/216, 296, 335/299, 301; 324/318, 319, 320; 62/51.1

[56] References Cited

U.S. PATENT DOCUMENTS

| | | | |
|---|---|---|---|
| 4,771,256 | 9/1988 | Laskaris et al. | 335/301 |
| 5,099,215 | 3/1992 | Woods et al. | 335/216 |
| 5,237,300 | 8/1993 | Ige et al. | 335/299 |

*Primary Examiner*—Lincoln Donovan
*Attorney, Agent, or Firm*—Dennis M. Flaherty; John H. Pilarski

[57] ABSTRACT

An improved actively shielded superconducting magnet in which the main and bucking coils are directly wound onto respective coil support structures made of glass fiber-reinforced epoxy. The main and bucking coil cartridges are held in a fixed concentric relationship via a pair of flanges located at opposite ends of a helium vessel. During manufacture of the main and bucking coil cartridges, the outer diameters of the respective coil support structures are machined with high precision. Also, the diameters of two concentric grooves are precisely machined on the inner surface of each helium vessel end flange to match the outer diameters of the main and bucking coil support structures, so that at room temperature the main and bucking coil cartridges can slide smoothly into these grooves. The helium vessel is made of aluminum alloy and has a coefficient of thermal expansion which is greater than that of the fiber-reinforced epoxy coil support structures. When the helium vessel is filled with liquid helium, the helium vessel end flanges hold the main and bucking coil cartridges tightly with predetermined amount of interference due to differential contraction of the aluminum alloy and the fiber-reinforced epoxy materials. This provides mechanical support to the main and bucking coil cartridges and ensures their concentricity. The relative axial positions of the main and bucking coil cartridges are fixed using the same working principle.

15 Claims, 4 Drawing Sheets

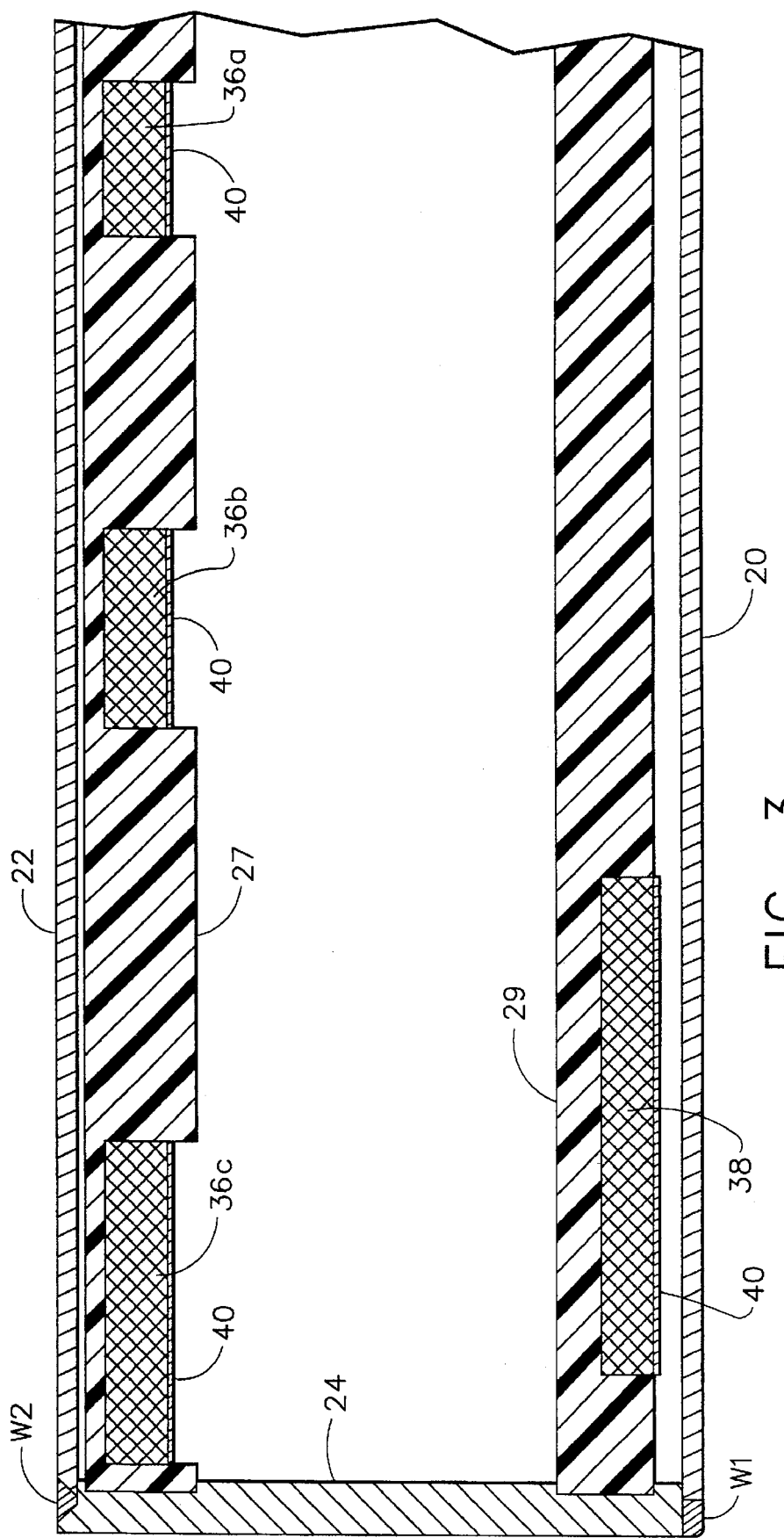

SIMPLIFIED ACTIVE SHIELD SUPERCONDUCTING MAGNET ASSEMBLY FOR MAGNETIC RESONANCE IMAGING

FIELD OF THE INVENTION

This invention relates to support structures for superconducting magnets. In particular, the invention relates to structures for supporting magnet coils of an active magnetic shielding system.

BACKGROUND OF THE INVENTION

As is well known, a coiled magnet, if wound with wire possessing certain characteristics, can be made superconducting by placing it in an extremely cold environment, such as by enclosing it in a cryostat or pressure vessel containing liquid helium or other cryogen. The extreme cold reduces the resistance in the magnet coils to negligible levels, such that when a power source is initially connected to the coil (for a period, for example, of 10 minutes) to introduce a current flow through the coils, the current will continue to flow through the coils due to the negligible resistance even after power is removed, thereby maintaining a magnetic field. Superconducting magnets find wide application, for example, in the field of magnetic resonance imaging (hereinafter "MRI").

The modern MRI system requires a high-strength uniform magnetic field in a large imaging volume, for example, a field having an inhomogeneity of a few parts per million over a spherical volume having a diameter of 40–50 cm. The signal-to-noise ratio of MRI is proportional to the field strength in the imaging region. To have a high-quality image, the field strength for MRI is usually required to be larger than 0.5 T and up to 2 or 3 T. On the other hand, the stray field produced by such a magnet must be limited to a small volume to minimize the environmental impact of a magnet of such large size. For example, since an MRI system is often installed in hospitals, which contain various electronic equipment and extraneous magnetic fields surrounding the MRI system location, the equipment must be isolated from the MRI magnetic field and the MRI system must be shielded from surrounding magnetic fields. Generally, the 5-Gauss line of a MRI magnet cannot be over about 2.5 m radially and 4.0 m axially. Active shield superconducting magnet technology was developed to meet the foregoing design goals.

A typical active shield magnet consists of two sets of superconducting coils. An inner set of coils, usually called the main magnet coils, produce a uniform magnetic field of large magnitude in a imaging volume. The conventional support structure for the main magnet coils is a circular cylindrical aluminum drum. The main coils are wound separately around stainless steel bobbins, placed in grooves machined in the drum and spaced axially along the inside of the drum. Another set of outer magnet coils, usually called bucking coils, are spaced from and surround the main coils, and are supported by a structure which is secured to the drum. The bucking coils carry currents in the direction opposite to the direction of currents being carried by the main coils so as to cancel the stray magnetic field outside the magnet. This is called active magnetic shielding.

However, in the process of energizing the magnets, or ramping the magnets to field, and in cooling the coils to superconducting temperatures, the coils are subjected to significant thermal and electromagnetic loading. As a result, actively shielded magnets pose difficult problems in terms of structural support. The principal reason for utilizing actively shielded magnets, as opposed to a passively shielded system, is that the latter would require massive amounts of magnetic material, such as iron, around the magnet, which would increase both the weight and volume of the system considerably. To minimize weight and volume through use of bucking coils, and thus realize the objectives of active magnetic shielding, it is important that the support structure for the bucking coils be relatively lightweight and yet withstand the significant magnetic and thermal loads placed upon it during energization and operation of an MRI system. It is also important that the bucking coils maintain close positional accuracy, notwithstanding the significant thermal loads during initial operation or cooldown of the MRI, and notwithstanding the electromagnetic loads generated during energization and operation. As a result, there are conflicting thermal, magnetic and mechanical considerations and factors which must be balanced and compromised to obtain an acceptable bucking coil assembly.

Thus, a conventional active shield magnet has a very complicated structure and has been expensive to build. An example of a known active shield magnet is described in U.S. Pat. No. 5,237,300. In accordance with that arrangement as shown in FIG. 1 annexed hereto, a plurality of main magnet coils 4a–4f produce a highly uniform magnetic field of large magnitude. The main coils are supported by a circular cylindrical drum 2 within machined pockets or grooves. Drum 2 is typically made of aluminum alloy. A pair of bucking coils 10a and 10b concentrically surround portions of drum 2 and main magnet coils 4a–4f. The bucking coils carry currents in a direction opposite to the direction in which currents are carried by the main magnet coils, thereby providing cancellation of magnetic fields in the region outside the MRI system. The bucking coils are supported on bucking coil support cylinders or bands 6 and 8, respectively. The supports for the bucking coils include a plurality of struts or plates 12 extending angularly outward from drum 2, or from bands 16 around the drum, to bucking coil support cylinders 6 and 8, with spacing rods 14 extending axially between the bucking coil support cylinders.

SUMMARY OF THE INVENTION

The present invention is an improved actively shielded superconducting magnet in which the main coils are directly wound onto the outer circumferential surface of a circular cylindrical coil support structure made of glass fiber-reinforced epoxy. Similarly, the bucking coils are directly wound on the outer circumferential surface of another circular cylindrical coil support structure made of glass fiber-reinforced epoxy and having a diameter greater than the diameter of the main coil support structure. Several layers of aluminum overwrap tape are wrapped on top of the main and bucking coil windings to constrain radially outward displacement of the coils during magnet energization.

In accordance with a preferred embodiment of the invention, the main coil cartridge and the bucking coil cartridge are held in a fixed concentric relationship via a pair of flanges located at opposite ends of a helium vessel. During manufacture of the main and bucking coil cartridges, the outer diameters of the respective coil support structures are machined with high precision. Also, two concentric grooves are machined on the inner surface of each helium vessel end flange. The respective diameters of these two grooves are precisely machined to match the outer diameter of the main and bucking coil support structures, so that at room temperature the main and bucking coil cartridges can slide smoothly into these grooves.

The helium vessel is made of aluminum alloy and has a coefficient of thermal expansion which is greater than that of the fiber-reinforced epoxy coil support structures. When the helium vessel is filled with liquid helium, the helium vessel end flanges hold the main and bucking coil cartridges tightly with a predetermined amount of interference due to differential contraction of the aluminum alloy and the fiber-reinforced epoxy materials. This not only provides mechanical support to the main and bucking coil cartridges, but also completely fixes the relative radial positions of the main and bucking coil cartridges so that their concentricity is assured.

The relative axial positions of the main and bucking coil cartridges are fixed using the same working principle. The depth of the grooves on the helium vessel end flanges is also precisely machined. During magnet assembly, one of the helium vessel end flanges is first positioned in a flat platform. The main and bucking coil cartridges are each vertically inserted and seated on the flange grooves and then locked by a set of keys. The inner and outer cylinders and the other end flange of the helium vessel are then assembled and welded together. After cooldown of helium vessel and magnet assembly, the axial differential contraction between the aluminum alloy helium vessel and the fiber-reinforced epoxy coil support structures will close any axial gaps between the helium vessel end flanges and the coil support structures and provide a firm support to the main and bucking coil cartridges.

The helium vessel/magnet assembly is then installed in a typical cryogenic vacuum enclosure which is fitted with peripheral equipment to produce magnetic resonance images.

BRIEF DESCRIPTION OF THE DRAWINGS

FIGS. 3–5 are schematic diagrams depicting respective partial sectional views of the helium vessel/magnet assembly shown in FIG. 2, with the sections being taken along lines 3—3, 4—4 and 5—5, respectively.

DETAILED DESCRIPTION OF THE PREFERRED EMBODIMENTS

Figure 1:
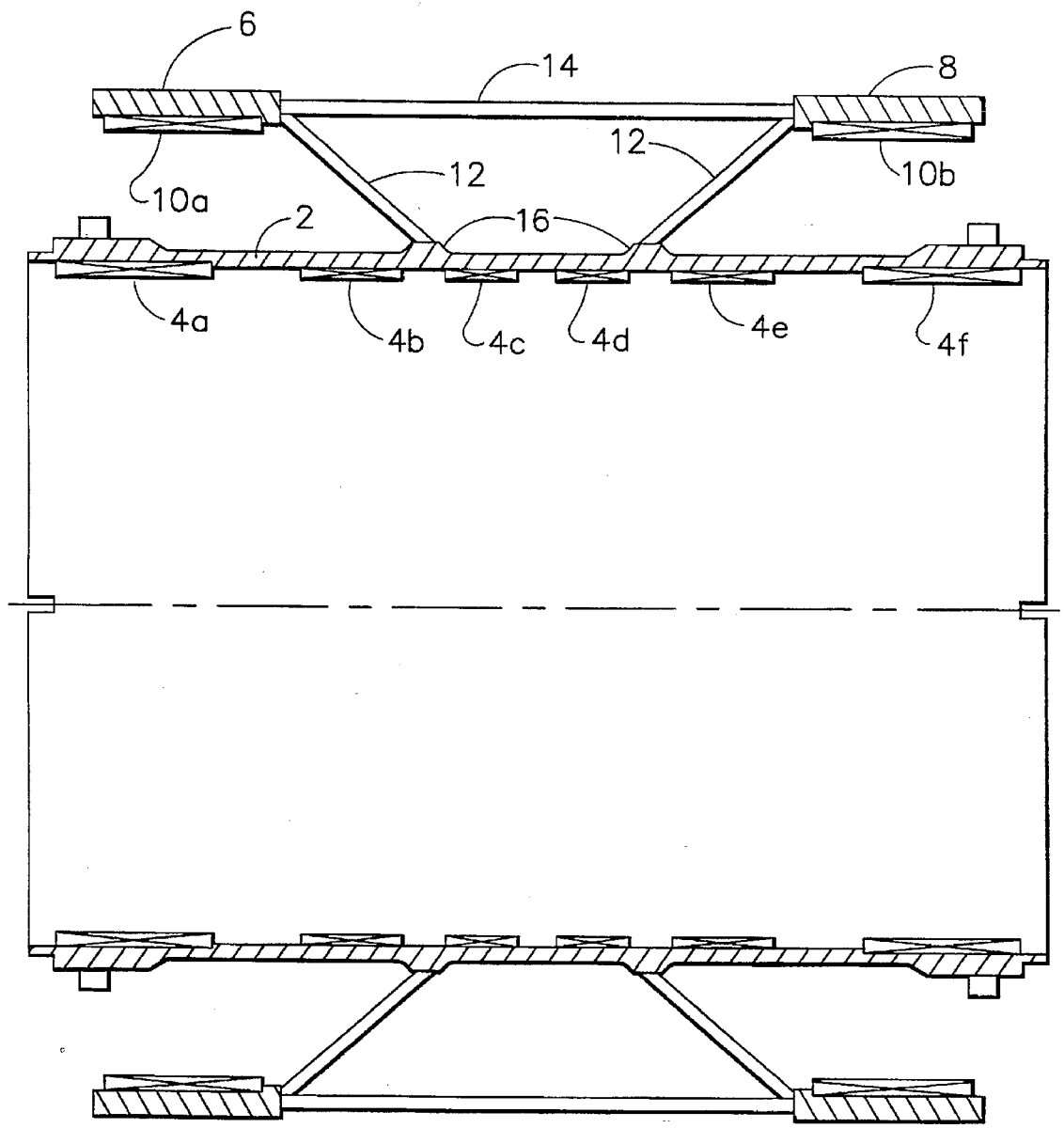
FIG. 1 is a schematic diagram depicting a side sectional view of a conventional actively shielded superconducting magnet assembly.
Figure 2:
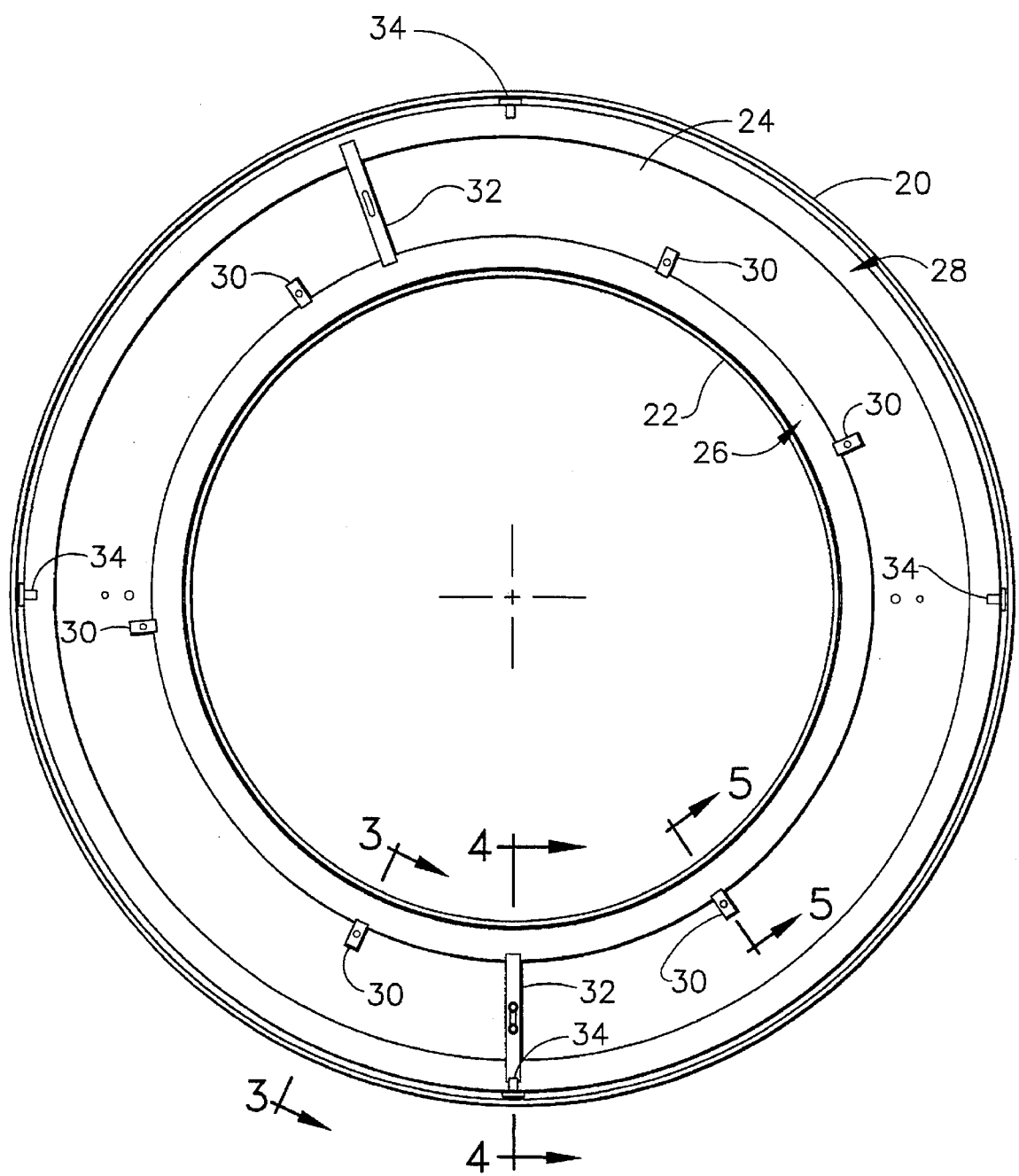
FIG. 2 is a schematic diagram depicting an interior end view of a helium vessel/magnet assembly in accordance with the preferred embodiment of the invention.

Referring to FIG. 2, the magnet assembly in accordance with the preferred embodiment of the invention comprises a leaktight vessel filled with liquid helium or other cryogen (hereinafter "helium vessel"). The helium vessel comprises a pair of mutually parallel, opposed end flanges 24, only one of which is shown in the drawings. Each end flange is an annular plate, preferably fabricated from aluminum alloy. The helium vessel further comprises an outer cylindrical wall 20 and an inner cylindrical wall 22, also made of aluminum alloy. Walls 20 and 22 are mutually concentric, with wall 20 having a radius greater than that of wall 22. As seen in FIG. 3, the ends of wall 20 are respectively welded to the outer peripheries of the end flanges 24 (weld W1), while the ends of wall 22 are respectively welded to the inner peripheries of the end flanges (weld W2). The final enclosed welded assembly has a generally toroidal shape.

In accordance with the preferred embodiment of the invention, the helium vessel contains a main coil cartridge 26 and a bucking coil cartridge 28 (see FIG. 2). Both cartridges are generally circular cylindrical, with the radius of cartridge 28 being greater than the radius of the cartridge 26. The main coil cartridge 26 has an inner circumferential surface of radius greater than the radius of the outer circumferential surface of the helium vessel inner cylindrical wall 22. Similarly, the bucking coil cartridge 28 has an outer circumferential surface of radius less than the radius of the inner circumferential surface of the helium vessel outer cylindrical wall 20.

As shown in FIG. 3, the main coil cartridge 26 comprises a main magnet coil support 27 and a plurality of main magnet coils (typically six or more) arranged in annular grooves formed on the outer circumferential surface of main magnet coil support 27. FIG. 3 shows only three of those main magnet coils designated 36a, 36b and 36c. The main magnet coils are directly wound on coil support 27 with specified tensions (typically 30–60 lbs.). Similarly, the bucking coil cartridge 28 comprises a bucking magnet coil support 29 and a plurality of bucking magnet coils (typically two or more) arranged in annular grooves formed on the outer circumferential surface of bucking magnet coil support 29. FIG. 3 shows only one of those bucking magnet coils designated 38. The bucking magnet coils are directly wound on coil support 29 with the same specified tensions. The coil support structures 27 and 29 are both made of glass fiber-reinforced epoxy. Several layers of aluminum overwrap tape 40 (typically 4 to 8 layers) are wrapped on top of the main and bucking coil windings to constrain radially outward displacement of the coils during magnet energization.

The coil supports 27 and 29 are held in a fixed concentric relationship by the end flanges 24 located at opposite ends of the helium vessel. During manufacture of the main and bucking coil cartridges, the outer diameters of the respective coil supports 27 and 29 are machined with high precision. Also, two concentric grooves are machined on the inner surface of each helium vessel end flange 24. The respective diameters of these two grooves are precisely machined to match the outer diameter of the main and bucking coil supports 27 and 29, so that at room temperature the main and bucking coil cartridges can slide smoothly into these grooves. The ends of main magnet coil support 27 are inserted in the smaller-radius annular grooves formed in the respective end flanges 24, and the ends of bucking magnet coil support 29 are inserted in the larger-radius annular grooves formed in the respective end flanges, as shown for one end flange in FIG. 3.

The helium vessel is made of aluminum alloy and has a coefficient of thermal expansion which is greater than that of the fiber-reinforced epoxy coil support structures. When the helium vessel is filled with liquid helium, the temperature of the helium vessel and magnet cartridges therein drops, causing the respective materials to contract. Due to differential contraction of the aluminum alloy and the glass fiber-reinforced epoxy, the helium vessel contracts more than the coil supports. One result of this differential thermal contraction is that each helium vessel end flange 24 holds the main and bucking coil cartridges 26 and 28 tightly with a predetermined amount of interference. This provides mechanical support to the main and bucking coil cartridges, and also fixes the relative radial positions of the main and bucking coil cartridges so that their concentricity is assured.

Another result of differential thermal contraction is that the relative axial positions of the main and bucking coil cartridges are fixed. During fabrication of the helium vessel end flanges, the depth of the annular grooves on each end flange 24 is precisely machined. During magnet assembly, one of the helium vessel end flanges is placed flat on a platform. Then the main and bucking coil cartridges are each vertically inserted in a respective annular groove until the radial endfaces of the inserted ends of the coil supports are seated on the bottom walls of the annular grooves in the end flange. The main magnet coil cartridge 26 is then locked against the end flange 24 by installing a plurality of latches 30 around the circumference of the main magnet coil cartridge 26, as seen in FIG. 2.

Figure 5:
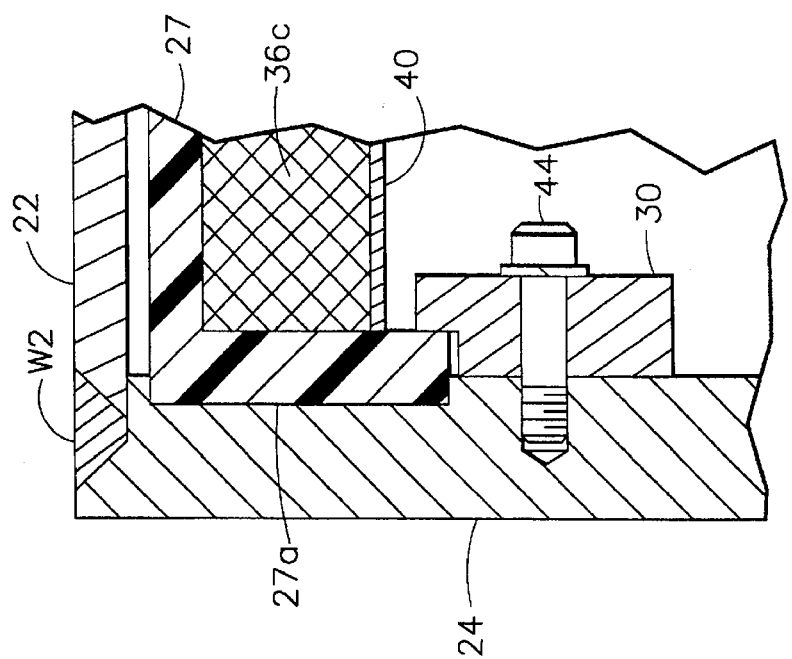

Referring to FIG. 5, each latch 30 is attached to the end flange 24 by a threaded fastener 44. The latch 30 has a projection which abuts lip 27a when fastener 44 is fully tightened, so that at that location the projection blocks axial displacement of inner coil support 27 in a direction away from the end flange. Installation of a plurality of latches 30 at intervals around the circumference (see FIG. 2) serves to lock the main magnet coil cartridge 26 against axial displacement relative to the end flange 24, as well as preventing yawing of cartridge 26 relative to the vessel centerline during subsequent assembly procedures.

Figure 4:
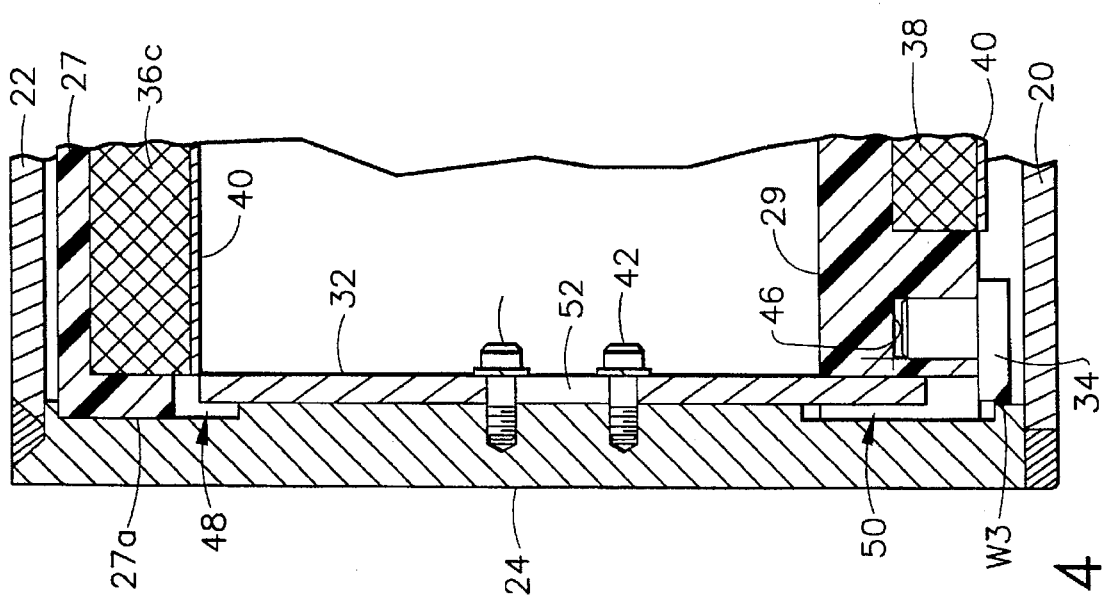

The bucking magnet coil cartridge 28 is held axially against the end flange 24 by means of a T-shaped key 34, shown in side profile in FIG. 4. The side of the key head confronting the end flange has a chamfer which defines a weld groove filled with weld material to form weld W3, by which key 34 and end flange 24 are joined. The shaft of key 24 fits snugly in a radial bore 46 of circular cross section which is machined in the bucking magnet coil support 28. Thus, when key 34 is welded to the end flange 24, axial displacement of outer coil support 29 in a direction away from the end flange is blocked at that location. Installation of a plurality of latches 34 at intervals around the circumference (see FIG. 2) serves to lock the bucking magnet coil cartridge 28 against axial displacement relative to the end flange 24, as well as preventing yawing of cartridge 28 relative to the vessel centerline during subsequent assembly procedures.

Referring to FIG. 2, relative circumferential displacement of magnet coil cartridges 26 and 28 is prevented by installation of a pair of bar-shaped keys 32. Each key 32 is attached to the end flange 24 by means of a pair of threaded fasteners 42 (see FIG. 2). Key 32 is provided with a rounded radial slot 52, through which the shafts of fasteners 42 pass. In the installed position, one end of key 32 is interlocked with an axial groove 48 formed in lip 27a of inner coil support 27, and the other end of key 32 is interlocked with a radial groove 50 formed in the endface of outer coil support 29 which contacts the radially outer annular groove in the end flange.

After the cartridges 26 and 28 are secured to the end flange 24, the inner cylindrical wall 22, the outer cylindrical wall 20 and the other end flange (not shown) of the helium vessel are assembled and welded together. After cooldown of the helium vessel and magnet assembly, the axial differential contraction between the aluminum alloy helium vessel and the fiber-reinforced epoxy coil supports will close any axial gaps between the helium vessel end flanges and the coil supports and provide a firm support to the main and bucking coil cartridges.

The preferred embodiment of the invention has been disclosed for the purpose of illustration. Variations and modifications which do not depart from the broad concept of the invention will be readily apparent to those skilled in the design of actively shielded superconducting magnets. All such variations and modifications are intended to be encompassed by the claims set forth hereinafter.

We claim:

1. A magnet assembly comprising:

a vessel comprising opposed first and second end flanges each having mutually concentric first and second annular grooves formed on an inner face thereof, an outer cylindrical wall having first and second ends respectively connected to said first and second end flanges, and an inner cylindrical wall having first and second ends respectively connected to said first and second end flanges, said inner cylindrical wall being surrounded by said outer cylindrical wall, and said first annular groove having a radius less than said second annular groove;

a circular cylindrical outer coil support contained in said vessel and having first and second ends inserted in said second annular grooves of said first and second end flanges respectively, said outer coil support having a first circumferential groove formed on its outer surface;

a circular cylindrical inner coil support contained in said vessel and having first and second ends inserted in said first annular grooves of said first and second end flanges respectively, said inner coil support having a first circumferential groove formed on its outer surface;

a first main magnet coil arranged in said first circumferential groove in said inner coil support; and a first bucking magnet coil arranged in said first circumferential groove in said outer coil support.

2. The magnet assembly as defined in claim 1, wherein said inner and outer coil supports are made of glass fiber-reinforced epoxy.

3. The magnet assembly as defined in claim 2, wherein said inner and outer cylindrical walls and said first and second end flanges are made of aluminum alloy.

4. The magnet assembly as defined in claim 1, wherein said first main magnet coil is wound directly on said inner coil support and said first bucking magnet coil is wound directly on said outer coil support.

5. The magnet assembly as defined in claim 1, wherein said outer coil support has a second circumferential groove formed on its outer surface and said inner coil support has a second circumferential groove formed on its outer surface, further comprising a second main magnet coil arranged in said second circumferential groove in said inner coil support, and a second bucking magnet coil arranged in said second circumferential groove in said outer coil support.

6. The magnet assembly as defined in claim 1, wherein each of said first and second end flanges is an annular plate having a radially outer periphery and a radially inner periphery.

7. The magnet assembly as defined in claim 6, wherein said first and second ends of said outer cylindrical wall are welded to said radially outer peripheries of said first and second end flanges respectively, and said first and second ends of said inner cylindrical wall are welded to said radially inner peripheries of said first and second end flanges respectively.

8. The magnet assembly as defined in claim 1, further comprising a latch attached to said first end flange by a threaded fastener, said latch having a projection which abuts a portion of said inner coil support and blocks axial displacement of said portion of said inner coil support in a direction away from said first end flange.

9. The magnet assembly as defined in claim 1, further comprising a key welded to said first end flange, said key having a projection which fits in a recess formed in a portion of said outer coil support and blocks axial displacement of said portion of said outer coil support in a direction away from said first end flange.

10. The magnet assembly as defined in claim 1, further comprising a key attached to said first end flange by first and second threaded fasteners, said key being configured and arranged such that a first end of said key projects into a groove in said inner coil support and a second end of said key projects into a groove in said outer coil support.

11. A magnet assembly comprising:

a vessel comprising mutually concentric inner and outer circular cylindrical walls, an annular volume between said inner and outer circular cylindrical walls being closed by first and second annular plates connected to said inner and outer circular cylindrical walls;

a circular cylindrical outer coil support contained in said vessel and having first and second end faces which contact said first and second annular plates respectively, said outer coil support having a circumferential groove formed on its outer surface;

a circular cylindrical inner coil support contained in said vessel and having first and second end faces which contact said first and second annular plates respectively, said inner coil support having a circumferential groove formed on its outer surface;

a first magnet coil arranged in said circumferential groove in said inner coil support; and a second magnet coil arranged in said circumferential groove in said outer coil support, wherein said inner and outer circular cylindrical walls are made of a first material having a first coefficient of thermal expansion, and said inner and outer coil supports are made of a second material having a second coefficient of thermal expansion, said second coefficient of thermal expansion being less than said first coefficient of thermal expansion.

12. The magnet assembly as defined in claim 11, wherein said first material is metal alloy and said second material is reinforced epoxy.

13. The magnet assembly as defined in claim 12, wherein said metal alloy is aluminum alloy and said reinforced epoxy is reinforced with glass fiber.

14. The magnet assembly as defined in claim 11, wherein said first magnet coil is wound directly on said inner coil support and said second magnet coil is wound directly on said outer coil support.

15. The magnet assembly as defined in claim 11, wherein each of said first and second annular plates has mutually concentric first and second annular grooves formed on one side thereof, said inner coil support has first and second ends inserted in said first annular grooves of said first and second end flanges respectively, and said outer coil support has first and second ends inserted in said second annular grooves of said first and second end flanges respectively.

* * * * *